United States Patent
Fritzemeier et al.

(10) Patent No.: US 8,236,603 B1
(45) Date of Patent: Aug. 7, 2012

(54) POLYCRYSTALLINE SEMICONDUCTOR LAYERS AND METHODS FOR FORMING THE SAME

(75) Inventors: Leslie G. Fritzemeier, Lexington, MA (US); Ryne P. Raffaelle, Honeoye Falls, NY (US); Christopher Leitz, Watertown, MA (US)

(73) Assignees: Solexant Corp., San Jose, CA (US); Rochester Institute of Technology, Rochester, NY (US)

( * ) Notice: Subject to any disclaimer, the term of this patent is extended or adjusted under 35 U.S.C. 154(b) by 106 days.

(21) Appl. No.: 12/554,486

(22) Filed: Sep. 4, 2009

Related U.S. Application Data

(60) Provisional application No. 61/094,119, filed on Sep. 4, 2008.

(51) Int. Cl.
*H01L 21/00* (2006.01)

(52) U.S. Cl. ............. 438/97; 438/57; 438/96; 438/482; 438/483; 438/486; 438/487; 438/488; 438/489; 438/491; 438/532; 438/969; 257/49; 257/52; 257/53; 257/64; 257/75

(58) Field of Classification Search .............. 438/482, 438/486, 487, 488, 57, 96, 97, 483, 489, 438/491, 532, 969; 257/49, 52, 64, 75, 53
See application file for complete search history.

(56) References Cited

U.S. PATENT DOCUMENTS

| | | | |
|---|---|---|---|
| 3,372,069 A | 3/1968 | Bailey et al. | |
| 4,128,733 A | 12/1978 | Fraas et al. | |
| 4,165,558 A | 8/1979 | Armitage, Jr. et al. | |
| 4,227,942 A | 10/1980 | Hall | |
| 4,321,099 A | 3/1982 | Frosch et al. | |
| 4,332,974 A | 6/1982 | Fraas | |
| 4,392,297 A | 7/1983 | Little | |
| 4,400,244 A | 8/1983 | Kroger et al. | |
| 4,514,583 A | 4/1985 | Izu et al. | |
| 4,530,739 A | 7/1985 | Hanak et al. | |
| 4,704,624 A | 11/1987 | Yamazaki et al. | |
| 4,707,216 A | 11/1987 | Morkoc et al. | |
| 4,774,194 A | 9/1988 | Hokuyou | |
| 4,808,462 A | 2/1989 | Yaba et al. | |
| 4,981,525 A | 1/1991 | Kiyama et al. | |
| 5,136,351 A | 8/1992 | Inoue et al. | |
| 5,156,995 A | 10/1992 | Fitzgerald, Jr. et al. | |
| 5,231,047 A | 7/1993 | Ovshinsky et al. | |
| 5,254,481 A | 10/1993 | Nishida et al. | |

(Continued)

FOREIGN PATENT DOCUMENTS

EP 1 109 230 6/2001

(Continued)

OTHER PUBLICATIONS

Huang et al., "Simultaneous Interfavial Misfit Array Formation and Antiphase Domain Suppression on Miscut Silicon Substrate," 92 Appl. Phys. Lett. 7, 3 pages. (2008).

(Continued)

*Primary Examiner* — Jay C Kim
(74) *Attorney, Agent, or Firm* — Bingham McCutchen LLP

(57) ABSTRACT

A semiconductor structure may include a polycrystalline substrate comprising a metal, the polycrystalline substrate having substantially randomly oriented grains, as well as a buffer layer disposed thereover. The buffer layer may comprise a plurality of islands having an average island spacing therebetween. A polycrystalline semiconductor layer is disposed over the buffer layer.

18 Claims, 5 Drawing Sheets

U.S. PATENT DOCUMENTS

| | | | |
|---|---|---|---|
| 5,279,679 | A | 1/1994 | Murakami et al. |
| 5,282,902 | A | 2/1994 | Matsuyama |
| 5,403,771 | A | 4/1995 | Nishida et al. |
| 5,433,169 | A | 7/1995 | Nakamura et al. |
| 5,484,664 | A | 1/1996 | Kitahara et al. |
| 5,538,903 | A | 7/1996 | Aramoto et al. |
| 5,575,862 | A | 11/1996 | Nishida et al. |
| 5,603,764 | A | 2/1997 | Matsuda et al. |
| 5,668,050 | A | 9/1997 | Iwasaki et al. |
| 5,677,236 | A | 10/1997 | Saitoh et al. |
| 5,690,736 | A | 11/1997 | Tokunaga et al. |
| 5,824,566 | A | 10/1998 | Sano et al. |
| 5,843,811 | A | 12/1998 | Singh et al. |
| 5,853,497 | A | 12/1998 | Lillington et al. |
| 5,897,331 | A | 4/1999 | Sopori |
| 5,913,986 | A | 6/1999 | Matsuyama et al. |
| 6,063,996 | A | 5/2000 | Takada et al. |
| 6,080,928 | A | 6/2000 | Nakagawa et al. |
| 6,121,541 | A | 9/2000 | Arya |
| 6,130,380 | A | 10/2000 | Nakamura et al. |
| 6,166,319 | A | 12/2000 | Matsuyama et al. |
| 6,180,870 | B1 | 1/2001 | Sano et al. |
| 6,184,456 | B1 | 2/2001 | Matsuyama et al. |
| 6,194,023 | B1 | 2/2001 | Mitsuhashi et al. |
| 6,246,070 | B1 * | 6/2001 | Yamazaki et al. ............ 257/40 |
| 6,277,714 | B1 | 8/2001 | Fonash et al. |
| 6,288,325 | B1 | 9/2001 | Jansen et al. |
| 6,331,208 | B1 | 12/2001 | Nishida et al. |
| 6,340,788 | B1 | 1/2002 | King et al. |
| 6,362,021 | B2 | 3/2002 | Ford et al. |
| 6,413,794 | B1 | 7/2002 | Sano et al. |
| 6,432,521 | B1 | 8/2002 | Yagi et al. |
| 6,482,668 | B2 | 11/2002 | Okada et al. |
| 6,525,264 | B2 | 2/2003 | Ouchida et al. |
| 6,541,695 | B1 | 4/2003 | Mowles |
| 6,548,751 | B2 | 4/2003 | Sverdrup, Jr. et al. |
| 6,562,702 | B2 | 5/2003 | Yagi et al. |
| 6,562,761 | B1 | 5/2003 | Fritzemeier et al. |
| 6,638,838 | B1 | 10/2003 | Eisenbeiser et al. |
| 6,645,313 | B2 | 11/2003 | Goyal et al. |
| 6,646,293 | B2 | 11/2003 | Emrick et al. |
| 6,673,646 | B2 | 1/2004 | Droopad |
| 6,730,410 | B1 | 5/2004 | Fritzemeier et al. |
| 6,750,394 | B2 | 6/2004 | Yamamoto et al. |
| 6,756,289 | B1 | 6/2004 | Nakagawa et al. |
| 6,765,240 | B2 | 7/2004 | Tischler et al. |
| 6,784,139 | B1 | 8/2004 | Sankar et al. |
| 6,815,605 | B1 | 11/2004 | Abe et al. |
| 6,869,863 | B2 | 3/2005 | Nishida et al. |
| 6,872,988 | B1 | 3/2005 | Goyal |
| 6,962,873 | B1 | 11/2005 | Park |
| 7,038,238 | B1 | 5/2006 | Yamazaki et al. |
| 7,067,856 | B2 | 6/2006 | Ramdani et al. |
| 7,075,002 | B1 | 7/2006 | Yamazaki et al. |
| 7,087,113 | B2 | 8/2006 | Goyal |
| 7,115,811 | B2 | 10/2006 | Ho et al. |
| 7,122,733 | B2 | 10/2006 | Narayanan et al. |
| 7,183,229 | B2 | 2/2007 | Yamanaka et al. |
| 7,211,521 | B2 | 5/2007 | Mauk |
| 7,256,142 | B2 | 8/2007 | Fitzgerald |
| 7,279,632 | B2 | 10/2007 | Nakajima et al. |
| 7,288,332 | B2 | 10/2007 | Findikoglu et al. |
| 7,339,109 | B2 | 3/2008 | Stan et al. |
| 7,342,276 | B2 | 3/2008 | Ooms et al. |
| 7,348,259 | B2 | 3/2008 | Cheng et al. |
| 7,601,430 | B2 | 10/2009 | Finkikoglu |
| 2003/0013280 | A1 | 1/2003 | Yamanaka |
| 2003/0019519 | A1 | 1/2003 | Toyama et al. |
| 2003/0027409 | A1 | 2/2003 | Ramdani et al. |
| 2003/0188680 | A1 | 10/2003 | Nakagawa et al. |
| 2003/0221718 | A1 | 12/2003 | Kubo et al. |
| 2003/0230338 | A1 | 12/2003 | Menezes |
| 2004/0245543 | A1 | 12/2004 | Yoo |
| 2004/0256624 | A1 | 12/2004 | Sung |
| 2005/0074915 | A1 | 4/2005 | Tuttle et al. |
| 2006/0021565 | A1 | 2/2006 | Zahler et al. |
| 2006/0049399 | A1 | 3/2006 | Lei et al. |
| 2006/0073978 | A1 | 4/2006 | Chason et al. |
| 2006/0115964 | A1 | 6/2006 | Findikoglu et al. |
| 2006/0185582 | A1 | 8/2006 | Atwater et al. |
| 2007/0044832 | A1 | 3/2007 | Fritzemeier |
| 2007/0051302 | A1 | 3/2007 | Gosain et al. |
| 2007/0163489 | A1 | 7/2007 | Son et al. |
| 2007/0181891 | A1 | 8/2007 | Eisert et al. |
| 2007/0215905 | A1 | 9/2007 | Kohiro et al. |
| 2007/0235824 | A1 | 10/2007 | Rakshit et al. |
| 2007/0261733 | A1 | 11/2007 | Hannour et al. |
| 2007/0277873 | A1 | 12/2007 | Cornfeld et al. |
| 2007/0277874 | A1 | 12/2007 | Dawson-Elli et al. |
| 2008/0023710 | A1 | 1/2008 | Park et al. |
| 2008/0050887 | A1 | 2/2008 | Chen et al. |
| 2008/0217622 | A1 | 9/2008 | Goyal |
| 2009/0114274 | A1 | 5/2009 | Fritzemeier |
| 2009/0117679 | A1 | 5/2009 | Fritzemeier |
| 2010/0193795 | A1 | 8/2010 | Fritzemeier et al. |
| 2010/0270653 | A1 | 10/2010 | Leitz et al. |

FOREIGN PATENT DOCUMENTS

| | | |
|---|---|---|
| EP | 1 469 528 | 10/2004 |
| WO | WO-85-05221 | 11/1985 |
| WO | WO-90-09039 | 8/1990 |
| WO | WO-91-03583 | 3/1991 |
| WO | WO-97-22152 | 6/1997 |
| WO | WO-98-09337 | 3/1998 |
| WO | WO-98-48079 | 10/1998 |
| WO | WO-00-16409 | 3/2000 |
| WO | WO-01-57932 A1 | 8/2001 |
| WO | WO-02-089188 | 11/2002 |
| WO | WO-2005/104236 | 11/2005 |
| WO | WO-2010/088366 | 8/2010 |

OTHER PUBLICATIONS

International Search Report and Written Opinion for International Patent Application No. PCT/US2010/022381, Jun. 17, 2010, 20 pages.

Cahn et al., eds., "Physical Metallurgy," p. 2482, Jan. 1, 1996, Elsevier Science, Amsterdam, XP002584210, ISBN: 0444898751.

International Search Report and Written Opinion for International Patent Application No. PCT/US2008/081984, mailed Apr. 28, 2010 (8 pages).

International Preliminary Report on Patentability for International Patent Application No. PCT/US2008/081984, dated May 4, 2010 (5 pages).

International Search Report and Written Opinion mailed on Dec. 7, 2010 for International Application No. PCT/US2010/032008 (16 pages).

Budal et al. "X-Ray Microdiffraction Study of Growth Modes and Crystallographic Tilts in Oxide Films on Metal Substrates," Nature Materials, vol. 2, pp. 487-492 (Jul. 2003).

Zhang et al., "Epitaxy of cubic boron nitride on (001)-oriented diamond," 2 Nature Materials, pp. 312-315 (May 2003).

International Search Report and Written Opinion for PCT/US2006/033115, mailed Oct. 2, 2007.

Mauk et al., "Large-grain (>1-mm), recrystallized germanium films on alumina, fused silica, oxide-coated silicon substrate for III-V solar cell applications," *Jrl of Crystal Growth*, 250 (2003) 50-56.

Ohmachi et al., "Zone-melting germanium film crystallization with tungsten encapsulation," *Appl. Phys. Let.* 43 (1) (Nov. 1983) 971-973.

Wilt et al., "GaAs Photovoltaics on Polycrystallline Ge Substrates" *Photovoltaic Energy Conversion, Conference Record of the 2006 IEEE 4th World Conference*, (May 2006) vol. 2, pp. 1891-1894.

\* cited by examiner

POLYCRYSTALLINE SEMICONDUCTOR LAYERS AND METHODS FOR FORMING THE SAME

CROSS-REFERENCE TO RELATED APPLICATION

This application claims priority to and the benefit of, and incorporates herein by reference in its entirety, U.S. Provisional Patent Application No. 61/094,119, which was filed on Sep. 4, 2008.

TECHNICAL FIELD

In various embodiments, the present invention relates to fabrication of semiconductor layers, and in particular to polycrystalline semiconductor layers on metallic substrates.

BACKGROUND

Both the alternative-energy and flat-panel display markets have a need for high-quality, flexible substrates on which to produce highly crystalline semiconductor thin films.

The current solar cell (i.e., photovoltaic) market relies on technology that has been essentially unchanged for decades. Most of the market is served by crystalline Si, either single-crystal or polycrystalline, with average conversion efficiencies of 12-20%. The costs of crystalline Si devices are high due to high-cost production methods and high demand for the raw materials in competition with the semiconductor electronics industry. Si devices also require thick silicon structures to achieve these efficiencies, consuming significant quantities of material. The remainder of the market is served largely by thin-film structures based on amorphous Si that is cheaper to produce but has typical energy conversion efficiencies below 7%. Amorphous Si efficiencies also degrade with time.

Higher conversion efficiencies, over 30%, have been demonstrated for thin film multi junction devices based on III-V semiconductors such as GaAs. However, their production costs are very high since these devices are most advantageously grown on expensive single-crystal Ge or GaAs wafers.

Emerging low-cost photovoltaic technologies include ribbon-grown Si, copper-indium-gallium-selenide and cadmium telluride thin films, polymeric/organic films, and nanotechnology-based approaches. None of these approaches fully realizes the objectives of increased production volume, increased efficiency and lower cost per watt generated.

What is needed is a method for the low-cost production of large areas of high-efficiency photovoltaic conversion cells.

A useful substrate for the growth of high-efficiency semiconductor films (e.g., III-V semiconductor films) preferably enables the growth of low-defect films (similar to those formed on single-crystal wafers) but at lower cost and over larger areas. Flexibility is also a useful attribute. The substrate should also be chemically compatible with both the semiconductor material and with the semiconductor process environment. The substrate coefficient of thermal expansion and lattice constant preferably match the semiconductor as closely as possible. These demanding attributes restrict the number of materials that may effectively be used.

Photovoltaic cells produced from polycrystalline Si wafers constitute a significant proportion of the current solar-power market, and III-V cells with useful performance have been produced from polycrystalline Ge wafers. However, especially in the case of Ge, the cost of the polycrystalline wafer constitutes a considerable barrier to broader adoption of solar power for consumer use. Polycrystalline wafers are also fragile and heavy, limiting their application in building-integrated designs.

Prior attempts to produce polycrystalline III-V directly on low-cost ceramic or metal foil substrates have been unsuccessful. III-V compounds such as GaAs require very high recrystallization temperatures and the vast difference in vapor pressures between the III and V elements may result in depletion of one element. As noted above, however, due to their fairly close lattice matching to Ge, various III-V compounds for photovoltaics may be advantageously deposited on Ge substrates. This technique is principally limited by its expense, but the resulting photovoltaic cells are also typically heavy and brittle, making them unsuitable for many applications.

The ability to utilize cheaper, flexible polycrystalline Ge-based substrates for photovoltaics would address many of the above challenges, but grain boundaries generally have a deleterious impact on photovoltaic cell performance. Thus, techniques are needed to advantageously select and/or enlarge the grain size of polycrystalline semiconductor films while at the same time minimizing any deleterious impact of processing (e.g., at elevated temperatures) upon such films.

SUMMARY

The foregoing limitations of conventional substrates for photovoltaic and other semiconductor-based devices are herein addressed by utilizing a lattice-matched, large-grained polycrystalline semiconductor film, e.g., Ge, as a template for the formation of high-quality compound semiconductor films and devices. In accordance with various embodiments of the invention, the polycrystalline template is itself formed on a flexible metal substrate at low cost and with quality similar to that of bulk polycrystalline semiconductor substrates. The metal substrate is preferably chemically compatible and/or substantially lattice-matched to the polycrystalline template film and/or the compound semiconductor films.

In accordance with embodiments of the invention, selectable (and preferably large) grain sizes in the polycrystalline films are formed via the utilization of a patterned (or "islanded") underlying buffer layer that acts as discrete nucleation sites for the grains of the polycrystalline film. Further, the grain size may be further selected and/or enlarged utilizing patterning techniques. Finally, lower temperature processing is enabled via the beneficial use of residual stress in the semiconductor films during recrystallization, minimizing process challenges such as agglomeration and thermal expansion mismatch.

In an aspect, embodiments of the invention feature a semiconductor structure. The semiconductor structure includes or consists essentially of a polycrystalline substrate and, disposed thereover, a buffer layer and a polycrystalline semiconductor layer. The polycrystalline substrate may include or consist essentially of a metal or a metal alloy, and may have substantially randomly oriented grains. The buffer layer may include or consist essentially of a plurality of islands having an average island spacing therebetween. The polycrystalline semiconductor layer may have an average grain size approximately equal to the average island spacing.

Embodiments of the invention may include one or more of the following features. The polycrystalline substrate may include or consist essentially of steel and/or a refractory metal such as Mo. The buffer layer may include or consist essentially of a metal, a metal alloy, and/or a dielectric material. The buffer layer may include or consist essentially of Cu, Al, W, and/or Re. The polycrystalline semiconductor layer may be disposed over substantially all of a top surface of the polycrystalline substrate. The polycrystalline semiconductor layer may include or consist essentially of Ge, GaAs, and/or InGaAs. A second polycrystalline semiconductor layer may be disposed over the polycrystalline semiconductor layer. The second polycrystalline semiconductor layer may include or consist essentially of a III-V compound. The polycrystalline semiconductor layer may include or consist essentially of a p-n junction and/or a p-i-n junction, and may be substantially lattice-matched to the polycrystalline substrate. The polycrystalline substrate may be substantially flexible. A mask may be disposed over the polycrystalline semiconductor layer, and the mask may separate a first portion of the layer consisting essentially of a single grain from a second portion of the layer including multiple grains. The first portion of the semiconductor layer may include more than approximately 50% of the total surface area of the semiconductor layer. A capping layer, which may include or consist essentially of at least one of Al, W, alumina, silicon dioxide, or silicon nitride, may be disposed over the polycrystalline semiconductor layer.

In another aspect, embodiments of the invention feature a method of forming a semiconductor structure. The method involves providing a polycrystalline substrate, forming a buffer layer over the polycrystalline substrate, and forming a semiconductor layer over the buffer layer. The polycrystalline substrate may include or consist essentially of a metal and/or a metal alloy, and may have substantially randomly oriented grains. The buffer layer may include or consist essentially of a plurality of islands having an average island spacing therebetween. The semiconductor layer may be substantially lattice-matched to the polycrystalline substrate, and forming the semiconductor layer may include or consist essentially of deposition at a deposition temperature and annealing at an annealing temperature greater than the deposition temperature. The annealing temperature may be less than the melting point of the semiconductor layer, the substrate, and/or the buffer layer. The method may be limited to (i.e., consist essentially of) these steps, or may include additional steps.

Embodiments of the invention may include one or more of the following features. The surface of the polycrystalline substrate may be polished prior to formation of the buffer layer. A mask may be formed over at least a portion of the semiconductor layer, and relative motion may be induced, in a travel direction, between the polycrystalline substrate and a high-temperature region. A single grain of the semiconductor layer may grow from the mask preferentially in the travel direction, thereby forming a single-crystalline portion of the semiconductor layer.

Forming the semiconductor layer may include nucleating a grain at a location of each of the plurality of islands of the buffer layer. A photovoltaic device may be formed over the semiconductor layer, and may include a p-n junction and/or a p-i-n junction formed in the semiconductor layer. Forming the semiconductor layer may include depositing the semiconductor in an amorphous state and recrystallizing the semiconductor layer into a polycrystalline state, and residual stress in the semiconductor layer may provide at least a portion of the driving force for recrystallization. The residual stress may decrease as a function of annealing time, and may be approximately zero after annealing. A capping layer including or consisting essentially of at least one of Al, W, alumina, silicon dioxide, or silicon nitride, may be formed over the semiconductor layer.

In a further aspect, embodiments of the invention feature a method for forming a semiconductor structure. The method involves providing a polycrystalline substrate having substantially randomly oriented grains and forming a buffer layer thereover. A polycrystalline semiconductor layer is formed over the buffer layer, and a mask is formed over the semiconductor layer. Relative motion between the polycrystalline substrate and a high-temperature region is induced in a travel direction, and a single grain of the semiconductor layer grows from the mask preferentially in the travel direction, thereby forming a single-crystalline portion of the semiconductor layer. The method may be limited to (i.e., consist essentially of) these steps, or may include additional steps.

The polycrystalline substrate may include or consist essentially of a metal and/or a metal alloy. The semiconductor layer may be substantially lattice-matched to the polycrystalline substrate, and forming the semiconductor layer may include or consist essentially of deposition at a deposition temperature and annealing at an annealing temperature greater than the deposition temperature. The annealing temperature may be less than the melting point of the semiconductor layer, the substrate, and/or the buffer layer. Prior to annealing the semiconductor layer, a capping layer including or consisting essentially of at least one of Al, W, alumina, silicon dioxide, or silicon nitride, may be formed over the semiconductor layer. A photovoltaic device may be formed over the single-crystalline portion of the semiconductor layer.

In yet another aspect, embodiments of the invention feature a method for forming a semiconductor structure. The method involves providing a polycrystalline substrate having substantially randomly oriented grains and forming a buffer layer thereover, depositing a semiconductor layer in an amorphous state over the buffer layer, inducing residual stress in the semiconductor layer, and recrystallizing the semiconductor layer into a polycrystalline state. The residual stress in the semiconductor layer provides at least a portion of the driving force for recrystallization. The residual stress may decrease as a function of annealing time, and may be approximately zero after annealing. The method may be limited to (i.e., consist essentially of) these steps, or may include additional steps.

The polycrystalline substrate may include or consist essentially of a metal and/or a metal alloy. Recrystallizing the semiconductor layer may include or consist essentially of annealing at a temperature below a melting point of the semiconductor layer, e.g., below approximately 85% of the melting point of the semiconductor layer. Prior to recrystallizing the semiconductor layer, a capping layer including or consisting essentially of at least one of Al, W, alumina, silicon dioxide, or silicon nitride, may be formed over the semiconductor layer. A photovoltaic device may be formed over the semiconductor layer.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
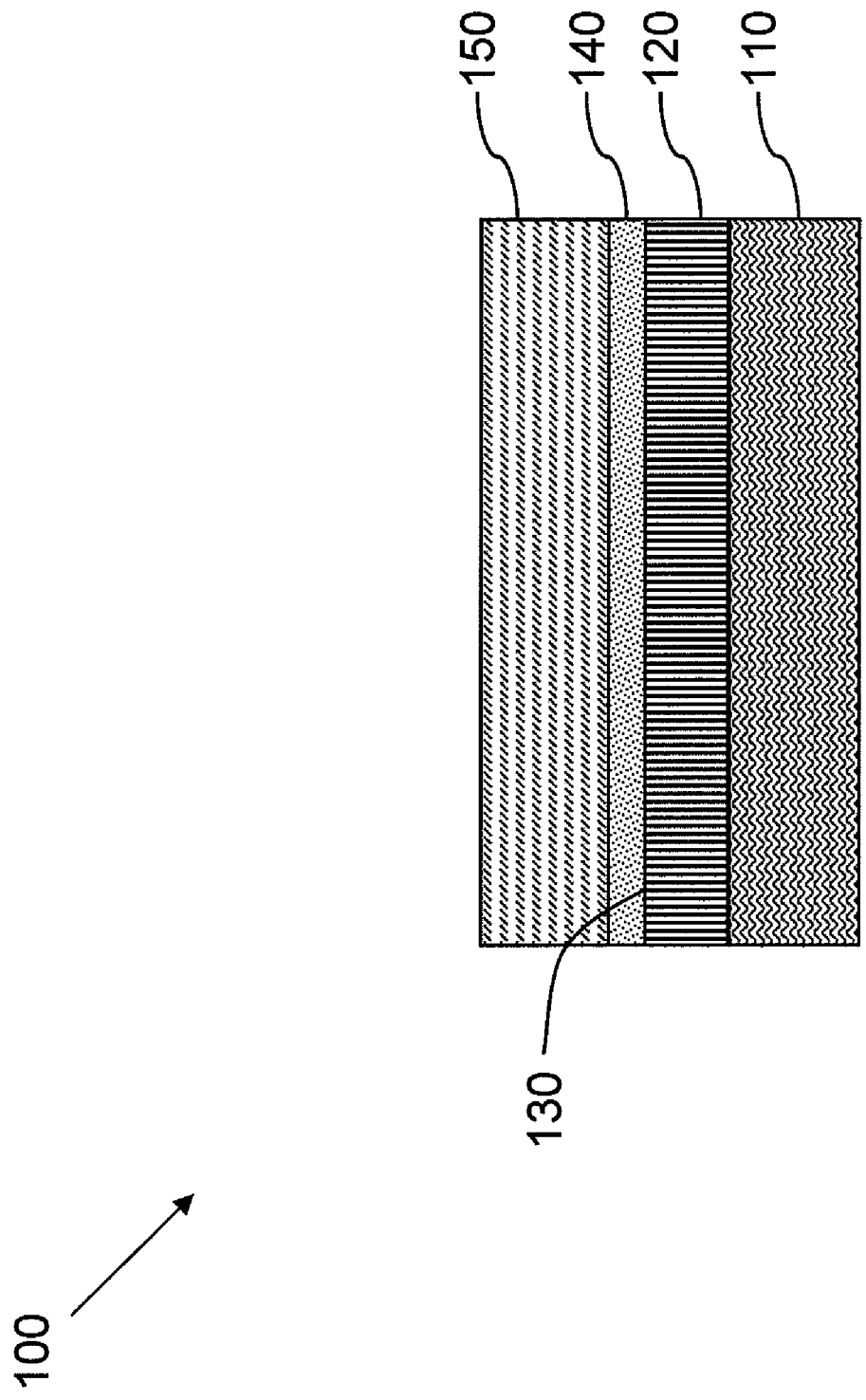
FIGS. 1A and 1B are cross-sectional schematics of exemplary layer structures formed in accordance with various embodiments of the invention.

In accordance with various embodiments of the present invention, a polycrystalline substrate provides support to a large-grain polycrystalline semiconductor film. The substrate may include or consist essentially of a metal or metal alloy. The orientations of the grains of the semiconductor film may be crystallographically random in at least the plane of the surface of the film. In preferred embodiments, the semiconductor film is substantially lattice-matched to the substrate. The substrate is preferably inexpensive, flexible, mechanically strong and/or compatible with a semiconductor processing environment. Generally, compatibility with a semiconductor processing environment includes resistance to degradation resulting from exposure to elevated temperatures and/or chemicals within the processing environment, including, e.g., resistance to hydrogen, arsenic, or silicon absorption. In alternative embodiments, the substrate may include or consist essentially of a glass or a ceramic material.

"Polycrystalline", as used herein, refers to material composed of multiple crystal grains that are typically separated by high-angle grain boundaries, i.e., boundaries between adjacent grains crystallographically misoriented by greater than approximately 11°, or even greater than approximately 15°. Preferably, the polycrystalline substrates are substantially, or even completely, free of any biaxial texture (e.g., a preferred grain-to-grain orientation) such as the well-known "cube texture."

"Substantially lattice-matched", as used herein, refers to materials (or at least a surface thereof) having relative lattice spacings that allow the epitaxial growth of one layer (e.g., a substrate) on the other (e.g., a semiconductor layer) with a controlled crystallographic orientation and an acceptable level of defects to enable the subsequent integration of high-quality semiconductor materials and/or high-efficiency semiconductor devices. For metallic films, lattice-matching may be within an approximately 10% relative difference in lattice spacing, preferably within approximately 5%, and more preferably within approximately 2%. The lattice spacing may refer to the material's unit-cell lattice constant as it is commonly defined in the art, or to another interatomic spacing that can be defined in reference to the lattice constant. For instance, the lattice constant of a material may be lattice-matched to the lattice spacing defined by the diagonal of a face of a cubic crystal (which is approximately equal to 1.414 times the lattice constant). Furthermore, a material having a lattice constant (or other lattice spacing) that is approximately an integral multiple (again, within approximately 10%, approximately 5%, or approximately 2%) of that of another material may also be considered to be "substantially lattice matched." For example, a material having a lattice spacing approximately twice that of a second material will achieve approximate lattice registry with every other atom of the second material. The necessary degree of matching may depend on the type of material under consideration. For example, a high-quality semiconductor layer may require closer lattice-matching to an underlying layer than a metal layer deposited on another metal layer. Non-limiting examples of lattice-matching include Cr and palladium (Pd), which are matched to within approximately 8%, as well as the cube-face diagonal of Cr and one-half the cube-face diagonal of Ge, which are matched to within approximately 3%.

"Chemically compatible", as used herein, refers to materials that do not react with or contaminate semiconductor layers to the extent that performance thereof is substantially affected. "Chemically compatible," as used herein, means that a material is not reactive with a semiconductor process environment and preferably is not reactive with and does not react with (at least at the processing temperatures contemplated herein) or contaminate a semiconductor material integrated thereon. Further, even if a reaction does occur, a chemically compatible material should not react with a semiconductor to the extent that it degrades the quality or performance of the semiconductor. As one non-limiting example of chemical compatibility, Ge and Cr may react to form a GeCr compound, but this compound is stable and does not affect the performance of either the Ge or other semiconductors formed atop the Ge.

Figure 1B:
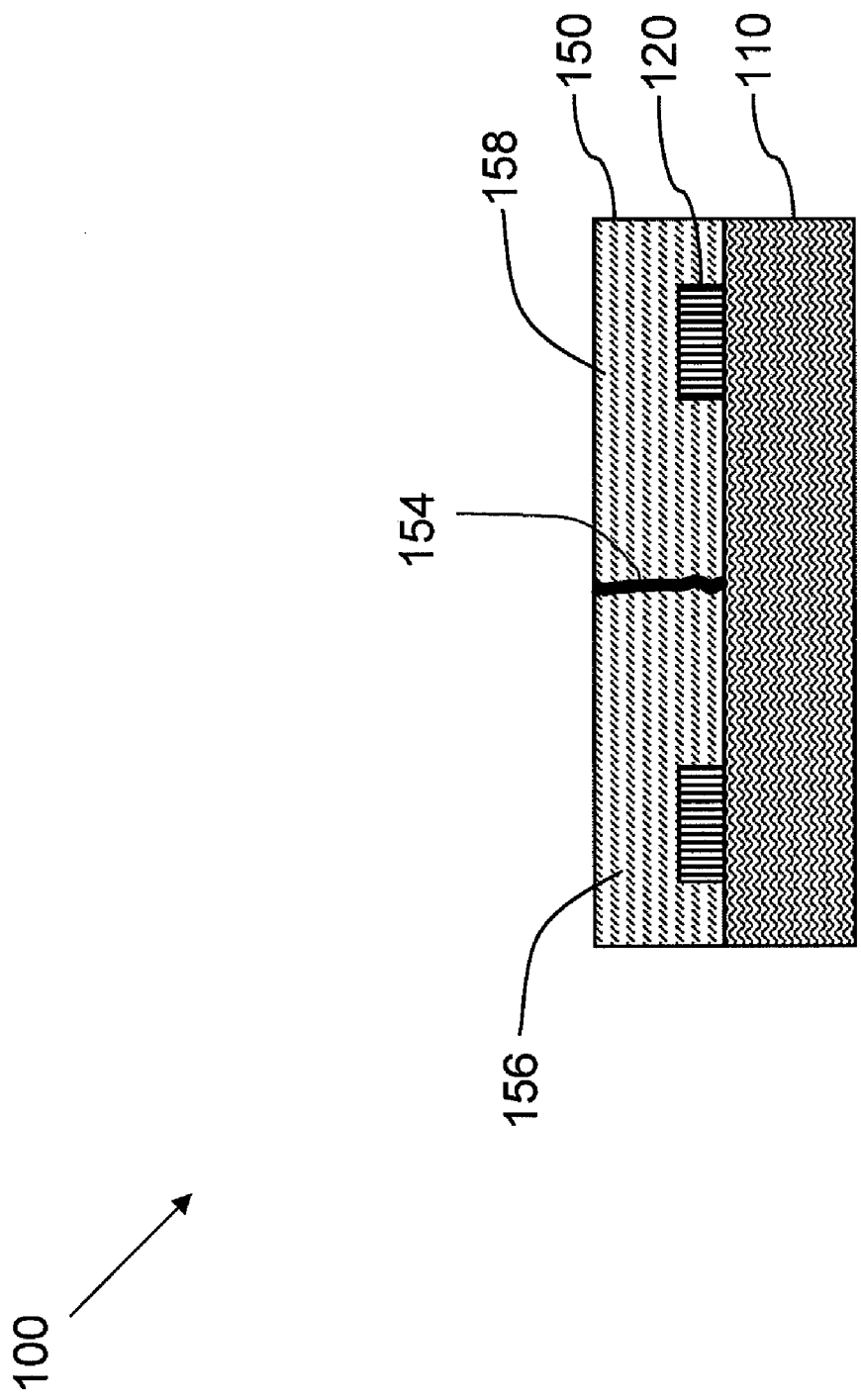

Referring to FIGS. 1A and 1B, a layer structure 100 includes a substrate 110 that includes or consists essentially of a metal or a metal alloy, e.g., stainless steel, low thermal expansion alloys (e.g., alloys of iron (Fe), nickel (Ni), and cobalt (Co), such as KOVAR), molybdenum (Mo), tungsten (W), or other refractory metals. In alternative embodiments, substrate 110 includes or consists essentially of a glass or ceramic material, e.g., soda-lime glass, alumina, or zirconia. Substrate 110 may have a coefficient of thermal expansion substantially similar to that of at least one layer formed thereover (as described further below), and may be substantially flexible. A thickness of substrate 110 may be between approximately 10 micrometers (μm) and approximately 100 μm, e.g., approximately 25 μm. A surface of substrate 110 may be polished, e.g., to mirror smoothness. Substrate 110 may be chemically stable at, and/or have a melting temperature higher than, temperatures greater than approximately 350° C.

At least one buffer layer 120 may be formed over substrate 110. Buffer layer 120 may include or consist essentially of, e.g., a metal, a metal alloy, or a dielectric material such as an oxide and/or a nitride. In various embodiments, buffer layer 120 includes or consists essentially of copper (Cu), aluminum (Al), tungsten (W), rhenium (Re), or another refractory metal. A thickness of buffer layer 120 may be between approximately 50 nanometers (nm) and approximately 1000 nm, e.g., between approximately 200 nm and approximately 500 nm. Buffer layer 120 may be a continuous film, i.e., substantially free of voids and substantially covering a surface of substrate 110, and may be substantially thermally and/or electrically conductive. Further, buffer layer 120 preferably has a low level of residual stress, e.g., less than approximately 500 MPa, or even approximately zero. Buffer layer 120 may be chemically stable at, have a melting temperature higher than, and/or be substantially chemically compatible with semiconductor materials such as Ge at, temperatures greater than approximately 350° C. Buffer layer 120 may be formed by deposition, e.g., evaporation, sputtering, chemical vapor deposition, metalorganic deposition, or by electrochemical means such as electroplating (with or without electrodes). In a preferred embodiment, low residual stress in buffer layer 120 is achieved via sputtering at approximately 25° C. The pressure at which sputtering is performed may depend on the atomic mass of the material being deposited. For example, W may be sputtered at approximately 17 mTorr, and Mo may be sputtered at approximately 5 mTorr.

A top surface 130 of buffer layer 120 may be chemically compatible with at least one layer formed thereover (as described further below), and may be substantially similar to a surface of a bulk polycrystalline semiconductor material (e.g., Si, Ge, or GaAs). Top surface 130 and/or other portions of buffer layer 120 may have large grain size (e.g., an average grain size greater than approximately 10 μm, or even greater than approximately 100 μm) and/or low surface roughness. The surface roughness may be, e.g., less than approximately 10 nm. Grains of top surface 130 and/or other portions of buffer layer 120 may have low defect densities therein. As depicted in FIG. 1B, buffer layer 120 may include or consist essentially of a plurality of islands having a spacing between approximately 20 μm and approximately 500 μm (or even more), e.g., approximately 100 μm. The islands may be formed by, for example, deposition through a mask, by the deposition of a thin film followed by a thermal anneal to coalesce the thin film into discrete and unconnected islands, or by the deposition of a uniform film followed by patterning. Patterning following deposition may be performed by, for example, laser ablation, chemical etching, and/or physical scribing. As a plurality of islands, buffer layer 120 may form preferred nucleation sites for subsequently deposited layers (as described further below). Such films may have average grain sizes approximately equal to the spacing between the islands of buffer layer 120.

Substrate 110 and/or buffer layer 120 may have a substantially cubic crystal structure, e.g., diamond cubic, face-centered cubic, or body-centered cubic.

An optional dielectric layer 140 may be formed over buffer layer 120. Dielectric layer 140 may include or consist essentially of an insulating material such as an oxide (e.g., silicon dioxide or alumina) or a nitride (e.g., silicon nitride). Dielectric layer 140 may provide electrical isolation between substrate 110 and layers formed thereover, and may be formed by, e.g., chemical vapor deposition or sputtering.

At least one semiconductor layer 150 may be formed over buffer layer 120. Semiconductor layer 150 may include or consist essentially of at least one group IV element or compound (e.g., Si, Ge, or SiGe), or a III-V compound (e.g., a compound including a combination of Al, Ga, In, As, P, and/or N), and may be doped (i.e., include n-type and/or p-type dopants). Semiconductor layer 150 may be substantially lattice-matched with substrate 110 and/or buffer layer 120, and is typically polycrystalline. Grains of semiconductor layer 150 may be substantially crystallographically oriented; the orientation may be, e.g., (100), (110), or (111). Semiconductor layer 150 may be formed by deposition, e.g., chemical vapor deposition, atomic layer deposition, molecular beam epitaxy, liquid phase epitaxy, or physical vapor deposition, at a deposition temperature between approximately 25° C. and approximately 700° C. The thickness of semiconductor layer 150 may be between approximately 100 nm and approximately 5 μm, e.g., approximately 2 μm. Semiconductor layer 150 may be formed with a fairly large residual stress, which may be advantageously utilized in subsequent recrystallization processes (as described below). A desired residual stress may be obtained via control of sputtering pressure, substrate bias, and/or ion bombardment during deposition of semiconductor layer 150. Alternatively, the residual stress may be imparted after formation of semiconductor layer 150. Suitable methods for imparting and/or increasing the residual stress may include, but are not limited to, ion beam bombardment, implantation of secondary atoms into the semiconductor layer, and/or the imposition of a cold thermal shock. Finally, residual stress may be imparted by the thermal expansion mismatch between semiconductor layer 150 and substrate 110, which leads to differential contraction resulting from cooling from the semiconductor deposition temperature.

In an embodiment, semiconductor layer 150 is formed at a temperature greater than its crystallization temperature. The crystallization temperature is the temperature at which the structure of the film transforms from amorphous to crystalline, i.e., the temperature in which measurable crystal structure is observed in the as-deposited layer. The crystallization temperature may be influenced by the type of deposition, the pressure at which deposition is conducted, and/or the rate of deposition. The crystallization temperature for Ge is approximately 300° C., depending on deposition conditions. In such embodiments, deleterious volume changes in semiconductor layer 150 are avoided during subsequent recrystallization processes (as further described below).

The thickness of semiconductor layer 150 may be between approximately 100 nm and approximately 5 μm, e.g., approximately 2 μm. In an embodiment, semiconductor layer 150 is doped to form a p-n junction and/or a p-i-n junction therein. Such a junction may function as part of a subsequently fabricated semiconductor device (as described further below). Semiconductor layer 150 may include or consist essentially of at least one homojunction or of at least one heterojunction (incorporating multiple semiconductor materials, e.g., forming a quantum well of one material "sandwiched" between layers of another material).

In a preferred embodiment, coefficients of thermal expansion of semiconductor layer 150 (and/or subsequently formed semiconductor materials and devices) and substrate 110 are substantially matched, thus enabling the fabrication of semiconductor materials and devices substantially free of deleterious residual stresses and/or cracks. According to various embodiments of the invention, substantially matched coefficients of thermal expansion have a relative difference of less than approximately 20%, preferably less than approximately 10-15%, and even more preferably less than approximately 5%. For example, a coefficient of thermal expansion of Mo is approximately $4.8 \times 10^{-6}/°$ C., matched to within approximately 15% of that of Ge or GaAs (approximately $5.7 \times 10^{-6}$/° C.).

In accordance with various embodiments of the invention, semiconductor layer 150 is amorphous (or polycrystalline with small average grain size, e.g., less than approximately 10 μm) when formed and subsequently recrystallized into a large-grained polycrystalline film. For example, a semiconductor layer 150 including or consisting essentially of Ge may be initially formed at a low temperature, e.g., approximately 25° C., and then recrystallized by annealing Annealing may be performed under vacuum or in an ambient including or consisting essentially of an inert gas (e.g., Ar), a reactive gas (e.g., $H_2$), or a dopant species (e.g., As or S). After annealing, semiconductor layer 150 may have a large grain size, e.g., grains having an average diameter greater than approximately 100 μm. A single anneal may be performed, or semiconductor layer 150 may be subjected to thermal cycling, i.e., repeated annealing and cool-down steps. In an embodiment, the annealing of semiconductor layer 150 is performed below a melting temperature thereof, thus preventing problems (such as agglomeration) that may occur when recrystallizing at temperatures above the melting point. Thus, annealing may be performed without the use of a capping layer above semiconductor layer 150. The annealing temperature may be greater than approximately 50% of the melting temperature of semiconductor layer 150, and may be less than approximately 85% of the melting temperature of semiconductor layer 150. Residual stress in semiconductor layer 150 may be utilized as an additional driving force for recrystallization, particularly during annealing or thermal cycles performed below the melting temperature of the layer. The magnitude of the residual stress may decrease as a function of annealing time, and may be approximately zero after annealing.

In an embodiment, an optional capping layer (not shown) is formed over and in direct contact with semiconductor layer 150 during recrystallization in order to provide nucleation sites for recrystallization or maintain planarity of semiconductor layer 150 during recrystallization. The capping layer may include or consist essentially of, e.g., a metal such as Al or W, or a dielectric material such as alumina, silicon dioxide, or silicon nitride. The capping layer is preferably inert with respect to, and chemically compatible with, semiconductor layer 150, and is preferably selectively removable (e.g., by etching) with respect to semiconductor layer 150. In a preferred embodiment, coefficients of thermal expansion of semiconductor layer 150 (and/or subsequently formed semiconductor materials and devices) and the capping layer are substantially matched (e.g., as defined above).

In embodiments in which semiconductor layer 150 is formed over a buffer layer 120 consisting of a plurality of islands, semiconductor layer 150 preferably nucleates on the surfaces of the islands 120 and grows outward therefrom, preferably coalescing into a uniform layer. In an alternative embodiment, semiconductor layer 150 nucleates on the surfaces of islands 120 but does not coalesce, instead remaining a plurality of discrete areas (which, after annealing, may be substantially single-crystalline). After annealing, the grain size of semiconductor layer 150 may be approximately equal to the spacing between islands 120. Thus, as depicted in FIG. 1B, a grain boundary 154 between adjacent grains 156, 158 of semiconductor layer 150 may be approximately equidistant from the islands 120 from which grains 156, 158 nucleated.

Semiconductor layer 150 may be formed above, below, or together with a reactive layer (not shown) chemically reactive and/or alloyable therewith. The reactive material and the semiconductor layer 150 may be annealed or co-deposited at a temperature sufficient to cause mixing and/or reaction therebetween. The reactive material may reduce the melting point of semiconductor layer 150 (e.g., may form a eutectic compound with semiconductor layer 150 with a corresponding eutectic melting point), and may enhance the wetting of semiconductor layer 150 to buffer layer 120 (thereby improving the uniformity of semiconductor layer 150). Reaction with the reactive layer may enable the formation of large grains (e.g., having an average diameter greater than approximately 100 μm) in semiconductor layer 150. Semiconductor layer 150 may be co-deposited with the reactive layer at a temperature above their eutectic point; semiconductor layer 150 with large grain size may solidify from the molten mixture. The reactive layer may include or consist essentially of, e.g., Al, Cu, Ni, Fe, and/or chromium (Cr).

Figure 2:
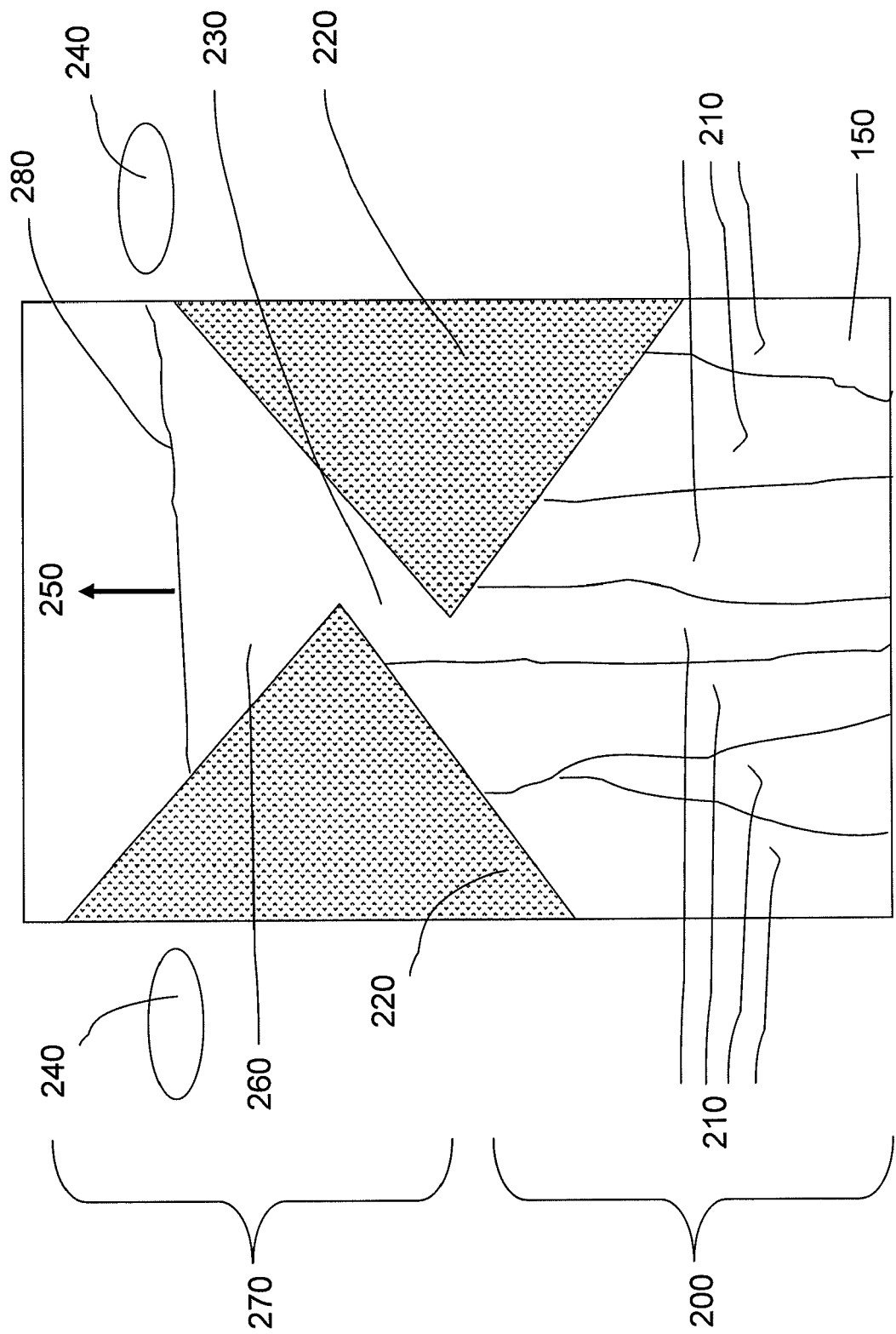
FIG. 2 is a plan view schematic of a patterned semiconductor layer formed in accordance with various embodiments of the invention.

Referring to FIG. 2, a semiconductor layer 150 (and/or a semiconductor layer formed thereover) may be patterned and recrystallized such that at least a portion thereof is substantially single-crystalline. A portion 200 of semiconductor layer 150 may be polycrystalline, i.e., may include a plurality of grains 210. Semiconductor layer 150 may be patterned by the formation of mask 220, which may include or consist essentially of a dielectric material such as an oxide. In an alternative embodiment, mask 220 is scribed and/or etched directly into semiconductor layer 150 by, e.g., mechanical scribing, laser scribing, or plasma etching. Portions of mask 220 may overlap in a serpentine fashion (i.e., may overlap in one direction but not in another direction) with a gap 230 therebetween. Substrate 110 (with semiconductor layer 150 thereover) is then moved relative to a high-temperature region 240 in direction 250. High-temperature region 240 may be formed by the resistive heating of substrate 110, an external resistive heater, a laser, a pulsed radiation source, a radiant source, an electron beam, and/or an inductive heater. Either high-temperature region 240 or substrate 110, or both, may be moved to induce the relative motion therebetween. Grains 210 may initially elongate substantially along direction 250, and the progression of all but one of grains 210 may be substantially blocked by mask 220, such that only a preferred grain 260 progresses through gap 230. A portion 270 of semiconductor layer 150 may then recrystallize as a substantially single-crystalline film as recrystallization front 280 (corresponding roughly to the location of high-temperature region 240) moves therethrough. Substantially single-crystalline portion 270 may be a substantial portion of semiconductor layer 150, e.g., greater than 50%, or even greater than 90%. In an embodiment, semiconductor layer 150 may be moved relative to high-temperature region 240 without mask 220 thereon, enabling elongation and/or growth of grains 210 along direction 250.

Figure 3:
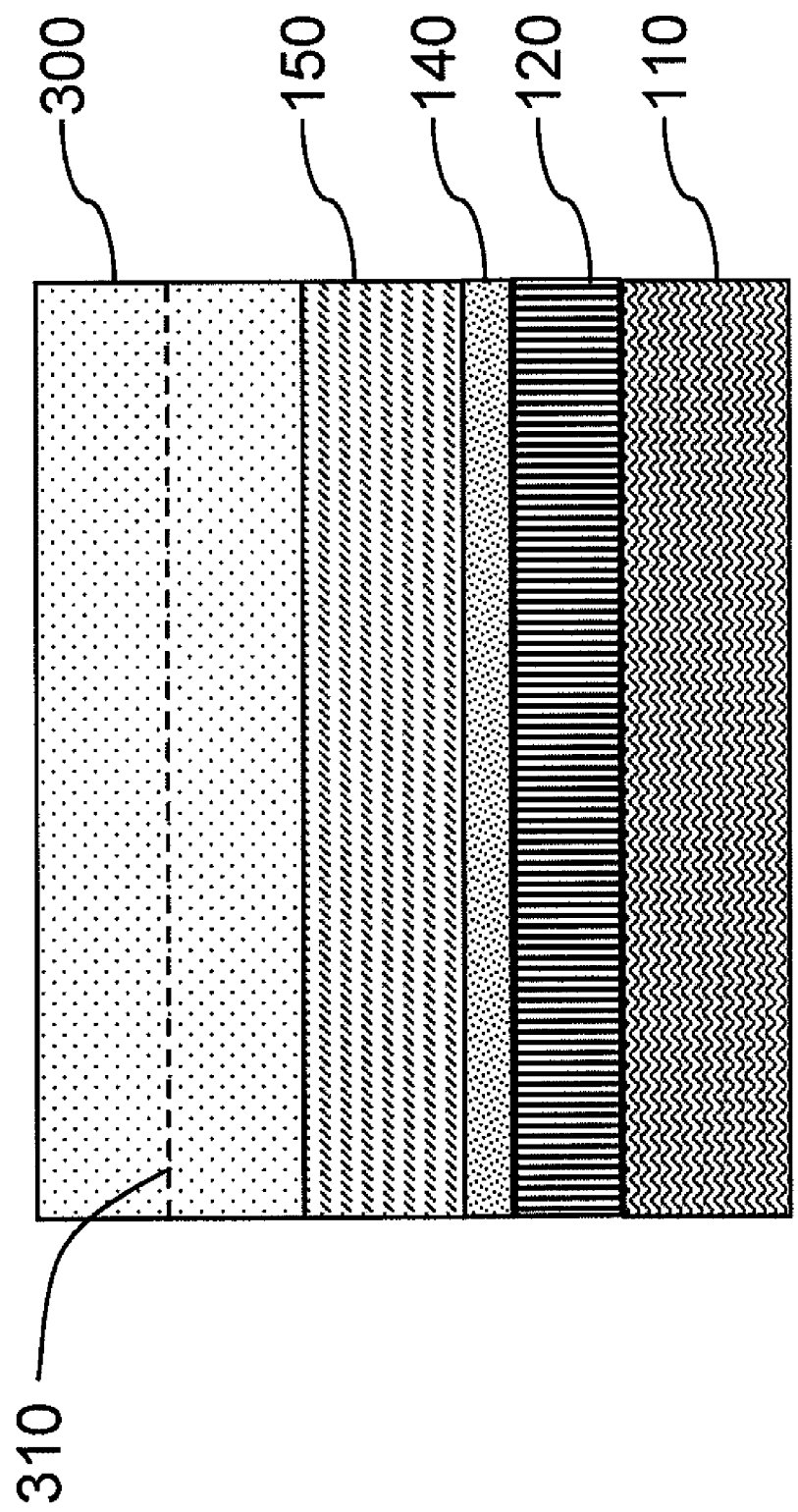
FIGS. 3 and 4 are schematic diagrams of the structure of FIG. 1A, 1B, or 2 after further deposition and processing in accordance with various embodiments of the invention.

Referring to FIG. 3, in various embodiments of the invention, a semiconductor device 300 is formed over semiconductor layer 150. Semiconductor device 300 may include or consist essentially of a photovoltaic cell (see also, e.g., FIG. 4), a light-emitting diode, a laser, or a display. Semiconductor device 300 may include or consist essentially of a III-V compound (e.g., a compound including a combination of Al, Ga, In, As, P, and/or N), and may be doped (i.e., include n-type and/or p-type dopants). In an embodiment, semiconductor device 300 includes or consists essentially of at least one of GaAs, AlGaAs, InGaP, InGaAsN, InGaAsP, InP, AlInAs, or InGaAs. Semiconductor device 300 may be doped to form at least one p-n junction and/or p-i-n junction. In FIG. 3, boundary 310 represents the approximate boundary between p- and n-type doped regions in a p-n junction or the intrinsic region in a p-i-n junction. Semiconductor device 300 may be lattice-matched to semiconductor layer 150, and may be polycrystalline with an average grain size substantially equal to that of semiconductor layer 200. Alternatively, in embodiments in which a single grain is "selected" as described above with reference to FIG. 2, semiconductor device formed above the single grain may also be substantially single-crystalline with an orientation substantially equal to that of the grain of semiconductor layer 150. Semiconductor device 300 may include or consist essentially of at least one homojunction or of at least one heterojunction.

Figure 4:
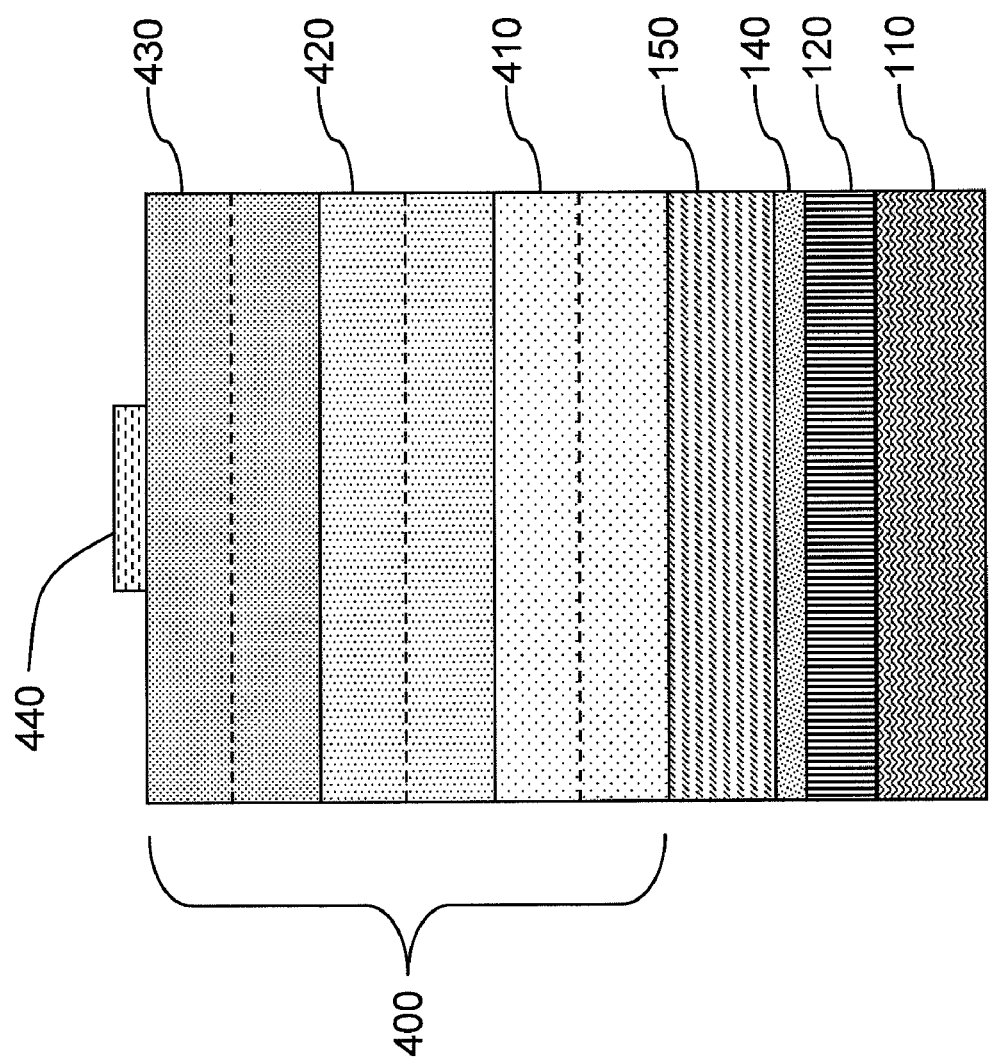

FIG. 4 illustrates a multijunction photovoltaic cell 400 formed over semiconductor layer 150. Cell 400 includes a plurality of p-n or p-i-n junctions; three such junctions 410, 420, 430 are depicted in FIG. 4. Each of the junctions may have a different bandgap; thus, each junction may absorb light of a different wavelength, increasing the overall efficiency of cell 400. The intrinsic layer in a p-i-n junction may decrease dark current of cell 400 (or a junction therein) by substantially preventing the formation of current leakage paths from the p-type doped layer to the n-type doped layer (or vice versa) along grain boundaries in one or more of the layers. One or more of the semiconductor materials in cell 400 may be substantially lattice-matched to semiconductor layer 150, and semiconductor layer 150 may include a p-n or p-i-n junction (and thus form an active portion of the device, as mentioned above). A top contact 440, which may include or consist essentially of, e.g., a metal or a transparent conductor (such as indium tin oxide), may be formed to enable electrical contact to cell 400. Substrate 110 may function as a back contact to cell 400. In structures containing an optional dielectric layer 140 over substrate 110, dielectric layer 140 may provide isolation between multiple semiconductor devices 300 and/or cells 400 formed over a common substrate 110. Cell 400 (and/or other semiconductor devices 300) may exhibit energy conversion efficiencies greater than approximately 15%, greater than approximately 20%, or even greater than approximately 30% under one-sun terrestrial illumination conditions. The devices may exhibit greater than 80% of the energy conversion efficiencies of substantially similar devices fabricated over single-crystal semiconductor substrates.

Other devices that may be formed over semiconductor layer 150 include optoelectronic devices such as light-emitting diodes and lasers, and displays.

The layer and/or device fabrication processes described herein may be practiced in a conventional batch or single-wafer process or by a roll-to-roll continuous or stepwise manufacturing method. The resulting devices may have surface areas greater than approximately 115 cm$^2$. Roll-to-roll processes may take place in a continuous system in which each step of the process is performed, or in a series of systems, each of which performing one or more of the steps in the process. A roll-to-roll process (or processes) may include or consist essentially of deposition of buffer layer 120, dielectric layer 140, one or more semiconductor layers 150, and even mask 220. A roll-to-roll process may also include the annealing of semiconductor layer 150. Moreover, devices and materials utilized in accordance with embodiments of the present invention may be substantially non-superconducting.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for forming a semiconductor structure, the method comprising:
   providing a polycrystalline substrate comprising a metal and having substantially randomly oriented grains;
   forming, over the polycrystalline substrate, a buffer layer comprising a plurality of spaced-apart islands;
   forming a semiconductor layer over the buffer layer;
   forming a mask over the semiconductor layer; and
   inducing relative motion, in a travel direction, between the polycrystalline substrate and a high-temperature region, wherein one grain of the semiconductor layer grows from the mask preferentially in the travel direction, thereby forming a single-crystalline portion of the semiconductor layer.

2. The method of claim 1, wherein, prior to the formation of the single-crystalline portion, the semiconductor layer has an average grain size approximately equal to an average spacing between the plurality of spaced-apart islands.

3. The method of claim 1, wherein forming the semiconductor layer comprises depositing an initial semiconductor layer at a deposition temperature and annealing the initial semiconductor layer at an annealing temperature greater than the deposition temperature, thereby forming the semiconductor layer.

4. The method of claim 3, wherein the annealing temperature is less than a melting point of the initial semiconductor layer.

5. The method of claim 1, further comprising forming a photovoltaic device over the single-crystalline portion of the semiconductor layer.

6. The method of claim 5, wherein the photovoltaic device comprises at least one of a p-n junction or a p-i-n junction.

7. The method of claim 1, wherein forming the semiconductor layer comprises:
   depositing an initial semiconductor layer in an amorphous state such that it retains residual stress after deposition; and
   crystallizing the initial semiconductor layer into a polycrystalline state, thereby forming the semiconductor layer,
   wherein the residual stress in the initial semiconductor layer provides at least a portion of a driving force for crystallizing the initial semiconductor layer.

8. The method of claim 1, further comprising forming a capping layer over the semiconductor layer, the capping layer comprising at least one of Al, W, alumina, silicon dioxide, or silicon nitride.

9. The method of claim 1, wherein forming the semiconductor layer comprises nucleating a grain at a location of each of the plurality of spaced-apart islands of the buffer layer.

10. The method of claim 1, wherein the polycrystalline substrate comprises at least one of steel or a refractory metal.

11. The method of claim 1, wherein the buffer layer comprises at least one of a metal, a metal alloy, or a dielectric material.

12. The method of claim 1, wherein the buffer layer comprises at least one of Cu, Al, W, or Re.

13. The method of claim 1, wherein the semiconductor layer comprises Ge.

14. The method of claim 1, wherein the single-crystalline portion is greater than 50% of the semiconductor layer.

15. The method of claim 14, wherein the single-crystalline portion is greater than 90% of the semiconductor layer.

16. The method of claim 1, wherein forming the semiconductor layer comprises:
   depositing an initial semiconductor layer;
   forming a capping layer over the initial semiconductor layer; and
   crystallizing the initial semiconductor layer, thereby forming the semiconductor layer.

17. The method of claim 16, further comprising removing the capping layer from the semiconductor layer.

18. The method of claim 16, wherein the capping layer comprises at least one of Al, W, alumina, silicon dioxide, or silicon nitride.

* * * * *